United States Patent
Ozarski et al.

(10) Patent No.: US 6,229,639 B1
(45) Date of Patent: May 8, 2001

(54) MULTIPLEXER FOR LASER LITHOGRAPHY

(75) Inventors: Robert G. Ozarski, Poway; Alexander I. Ershov, San Diego, both of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/112,631

(22) Filed: Jul. 9, 1998

(51) Int. Cl.⁷ ................................................ G02B 26/08
(52) U.S. Cl. ...................... 359/223; 372/24; 359/115; 359/225; 359/220; 359/221; 359/850
(58) Field of Search .................... 359/220, 221, 359/223, 225, 226, 633, 634, 636, 839, 855, 856, 857, 861, 115, 850

(56) References Cited

U.S. PATENT DOCUMENTS

| | | |
|---|---|---|
| 3,512,868 | 5/1970 | Gorkiewicz et al. ................. 350/157 |
| 3,993,402 * | 11/1976 | Fredrick ................................ 359/226 |
| 4,403,139 | 9/1983 | De Loach, Jr. ....................... 250/205 |
| 4,588,262 | 5/1986 | Nelson ................................. 350/401 |
| 4,773,750 * | 9/1988 | Bruning ............................... 353/122 |
| 4,785,192 * | 11/1988 | Bruning ............................... 250/548 |
| 4,917,453 | 4/1990 | Block et al. ......................... 350/96.2 |
| 5,036,042 * | 7/1991 | Hed ..................................... 359/839 |
| 5,173,957 | 12/1992 | Bergano et al. ...................... 385/24 |
| 5,576,901 * | 11/1996 | Hanchett ............................. 359/856 |
| 5,612,968 | 3/1997 | Zah ....................................... 372/50 |
| 5,880,817 | 3/1999 | Hashimoto ............................ 355/53 |
| 6,067,306 * | 5/2000 | Sandstrom ............................ 372/38 |
| 6,088,379 * | 7/2000 | Owa ..................................... 372/97 |

* cited by examiner

Primary Examiner—Teresa M. Arroyo
Assistant Examiner—Jeffrey Zahn
(74) Attorney, Agent, or Firm—John R. Ross, Esq.

(57) ABSTRACT

A laser lithography system in which two or more lasers provide laser illumination for two or more lithography exposure tools through a laser beam multiplexer. The mulitplexer contain several mirror devices each having a multi-reflectance mirror with surfaces of different reflectance and an adjusting mechanism for positioning one of the surfaces to intersect a laser beam from at least one of the lasers and direct a portion of it to at least one of the exposure tools.

9 Claims, 9 Drawing Sheets

MULTIPLEXER FOR LASER LITHOGRAPHY

This invention relates to laser lithography and in particular to control systems for laser lithography.

BACKGROUND OF THE INVENTION

Excimer lasers are currently used for the integrated circuit lithography. They provide a light for exposure of integrated circuits with the wavelength of 248 nm (KrF lasers) of 193 nm (ArF lasers). These wavelengths are in deep UV region and allow printing of smaller features as compared to the previous generation illumination sources based on I-line and G-line mercury lamps with the wavelengths of 365 nm and 435 nm. Laser based deep UV exposure tools such as steppers and scanners allow the exposure of circuits with critical dimensions of less than about 0.3 $\mu$m.

As a result of industry transition to deep UV lithography the cost of light source as well as the overall exposure system has increased substantially. On the other hand, the productivity of these exposure tools, usually measured in number of wafers exposed per hour as well as the size of the wafers has also increased. As a result of all these changes, the cost of operation has increased which means that the cost of downtime has also increased.

The excimer laser is a sophisticated piece of equipment and is commercially available from suppliers such as Cymer, Inc. Even though the state of the art excimer lasers are normally very reliable pieces of equipment, they do break down occasionally. Moreover, they do require certain preventive maintenance to be performed on a relatively regular basis. For example, the working gas mixture is normally replaced every 100 hours. Certain individual components of the laser have limited life and therefore should be replaced periodically. For example, optical components, such as windows in the laser chamber and the output coupler should be replaced on a relatively regular basis. After somewhat larger number of pulses, which might be equivalent of several months or even years of laser operation, core modules of the laser should be changed as well. Such core modules include, for example, laser discharge chamber, optical-line narrowing module, power supply, pulse power module, etc. These operations maintenance operations typically require downtimes of a few hours to possibly a few days.

When the laser is down for whatever reason, the whole illumination system is down which might be very expensive, possibly up to many thousand dollars per hour.

Therefore, the object of the present invention is to provide a microlithography exposure system which avoids lithography system down time due to laser down time.

SUMMARY OF THE INVENTION

The present invention comprises a laser lithography system in which two or more lasers provide laser illumination for two or more lithography exposure tools through a laser beam multiplexer. The mulitplexer contain several mirror devices each having a multi-reflectance mirror with surfaces of different reflectance and an adjusting mechanism for positioning one of the surfaces to intersect a laser beam from at least one of the lasers and direct a portion of it to at least one of the exposure tools.

DETAILED DESCRIPTION OF PREFERRED EMBODIMENTS

A typical semiconductor chip has multitude of layers which can be as many as 20–30 layers which needs to be exposed using microlithography. Out of this multitude of layers, there can be up to 5–10 critical layers which require the highest resolution and have the smallest features. These layers are normally exposed with a deep UV lithography system. Therefore, a typical semiconductor fabrication facility would have at least several deep UV exposure systems (steppers or scanners) each of them having its own laser. The present invention teaches the method of multiplexing these exposure systems and lasers into one integrated multi exposure system, so that different exposure systems can share the lasers. Therefore, if a laser needs maintenance, the exposure system can use light generated by remaining lasers and still be operational. As normal operation of the exposure system requires relatively low duty cycle of the laser, typically 50% or less, that extra load on remaining lasers during a laser downtime can be met by increased duty cycle of the remaining lasers, so that no reduction in the overall system throughput happens.

Figure 1:
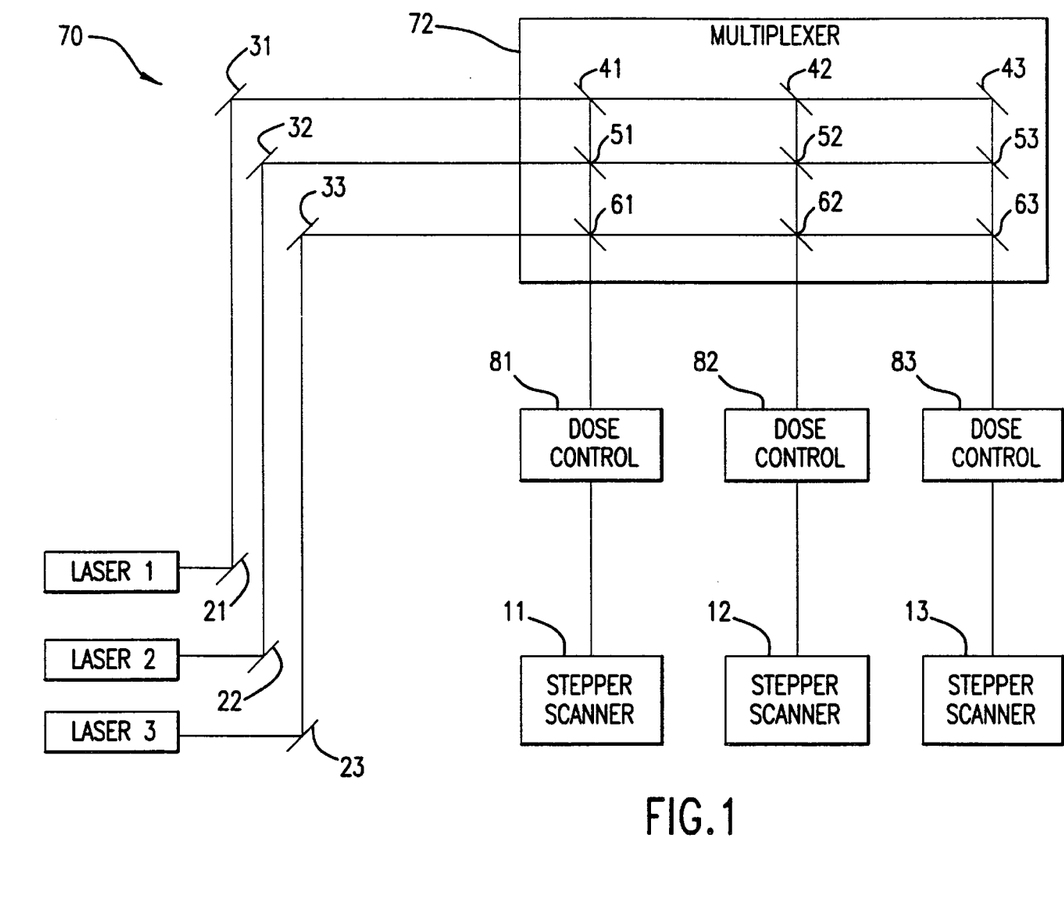
FIG. 1 is a block diagram of a preferred embodiment of the present invention.
Figure 8:
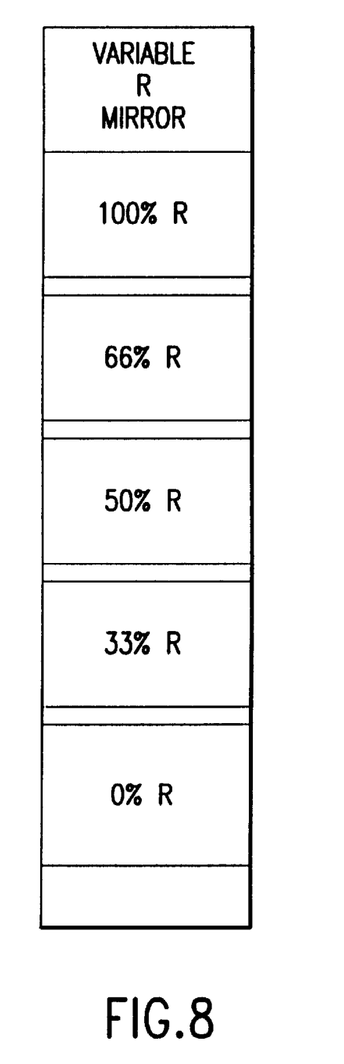
FIGS. 8 and 9 show embodiments of multi-reflection mirrors.
Figure 9:
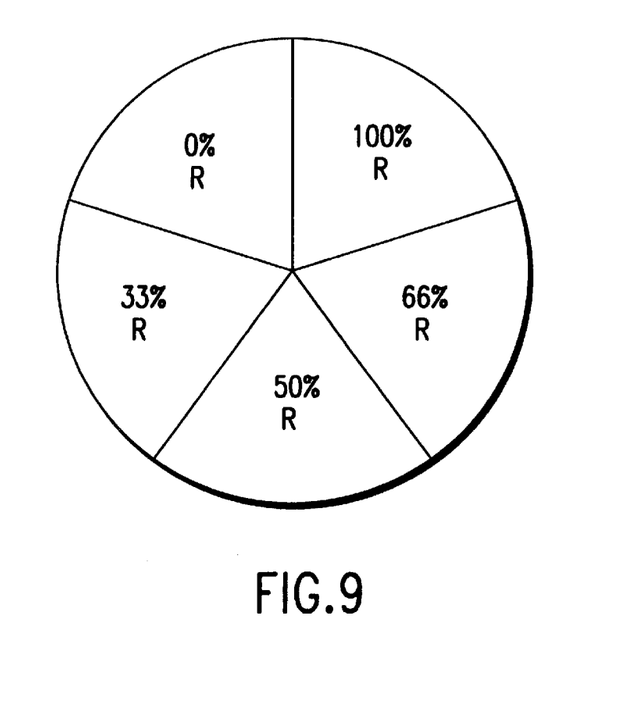

The first embodiment of the preferred invention is shown in FIG. 1. The integrated exposure system 70 consists of several exposure systems (either scanners or steppers) shown as 11, 12, and 13. Only three of these systems are shown but the actual amount can be bigger or smaller. Three excimer lasers 1, 2 and 3 are used as a light source. The light from each laser is delivered to the multiplexer 72, using beam delivery mirrors 21, 22, 23, 31, 32 and 33. The multiplexer 72 consists of a plurality of delivery mirrors shown as mirrors 41, 42, 43, 51, 52, 53, 61, 62 and 63. The purpose of these delivery mirrors is to multiplex and deliver the light into the exposure systems 11–13. Each of these delivery mirrors 41–63 actually consists of several mirrors as shown in FIG. 8 and FIG. 9 with different reflectivities (100%, 66%, 50%, 33% and 0%) which can be indexed into position by a mechanical position system (not shown). The reflectivity of the mirror is chosen based on the number and positions of lasers available at any particular time and/or the number and positions of the stepper/scanner systems operating at any particular time.

Figure 2:
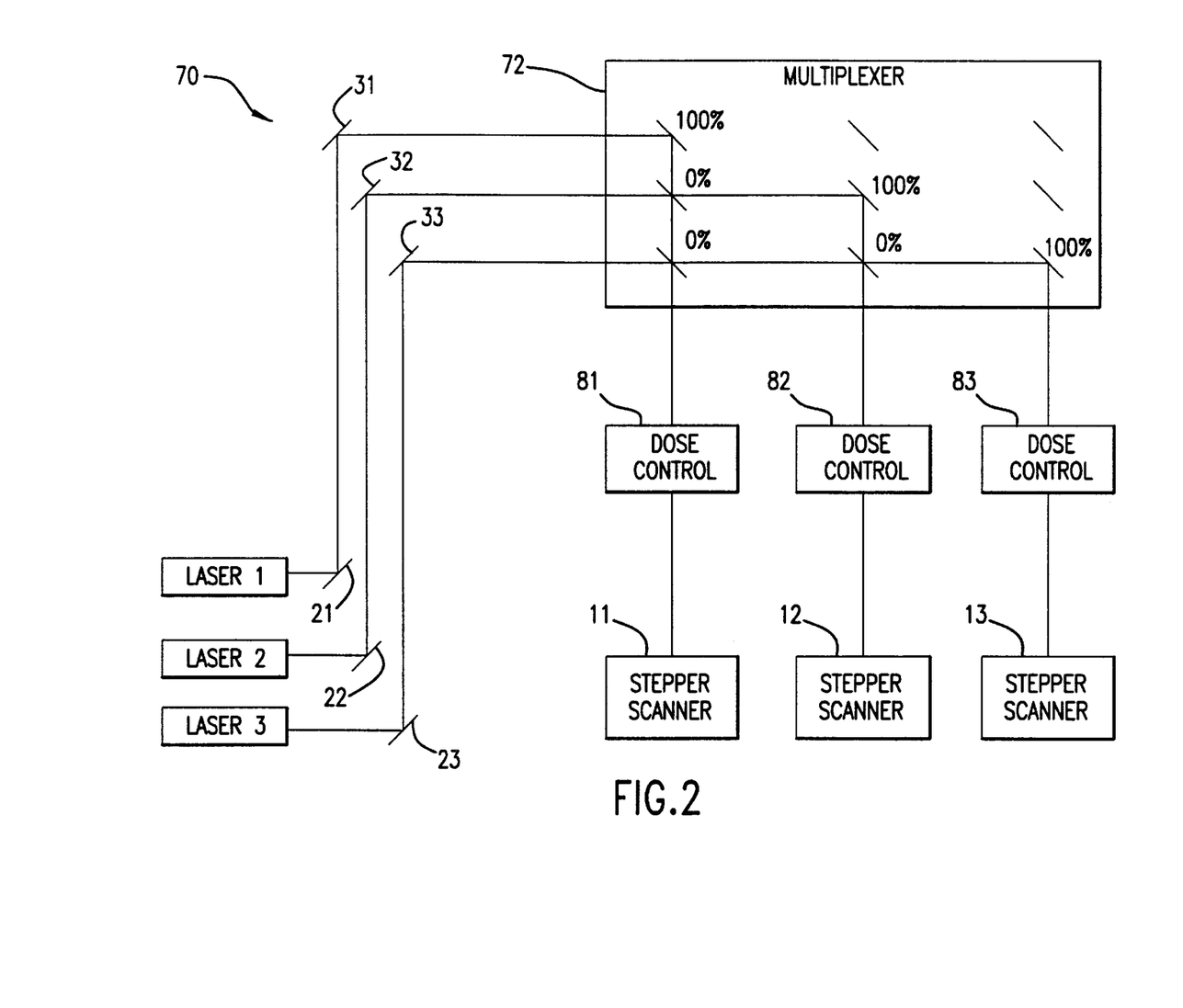
FIGS. 2–7 show various configurations of the FIG. 1 embodiment.

As an example, let's consider the system shown in FIG. 1 having 3 exposure systems integrated. There are several possibilities:

1. All three lasers and all three stepper/scanners are working. This situation is shown in FIG. 2. In this case the system would deliver light from laser 1 to exposure system 11, from laser 2—to exposure system 12, from laser 3—to exposure system 13. Mirrors 41, 52, and 63 (see FIG. 1 to identify mirrors by reference number) would have a reflection coefficient 100 percent while all other mirrors of the multiplexer 72 will be removed or have substantially zero reflectance.

Figure 3:
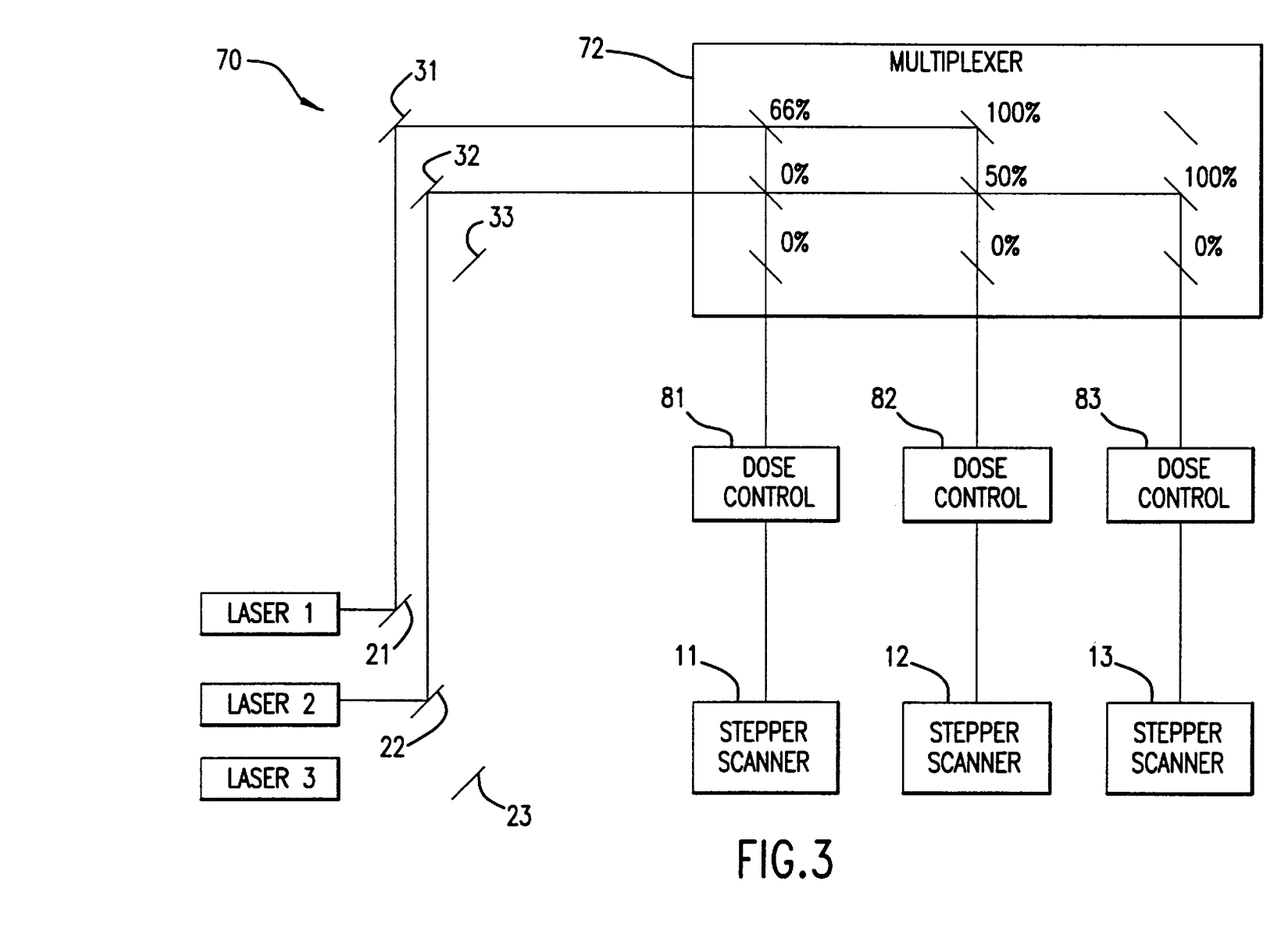

2. Laser 3 is down, lasers 2 and 1 are working and all three stepper/scanners are working. This situation is shown in FIG. 3. In this case, mirror 41 has a reflectivity of 66%, mirror 42 has a reflectivity of 100%, mirror 52 has a reflectivity of 50%, mirror 53 has a reflectivity of 100%, all other mirrors absent or have substantially zero reflectance. As a result, each system 11–13 receives about ⅔ of the total laser energy from a single laser.

Figure 4:
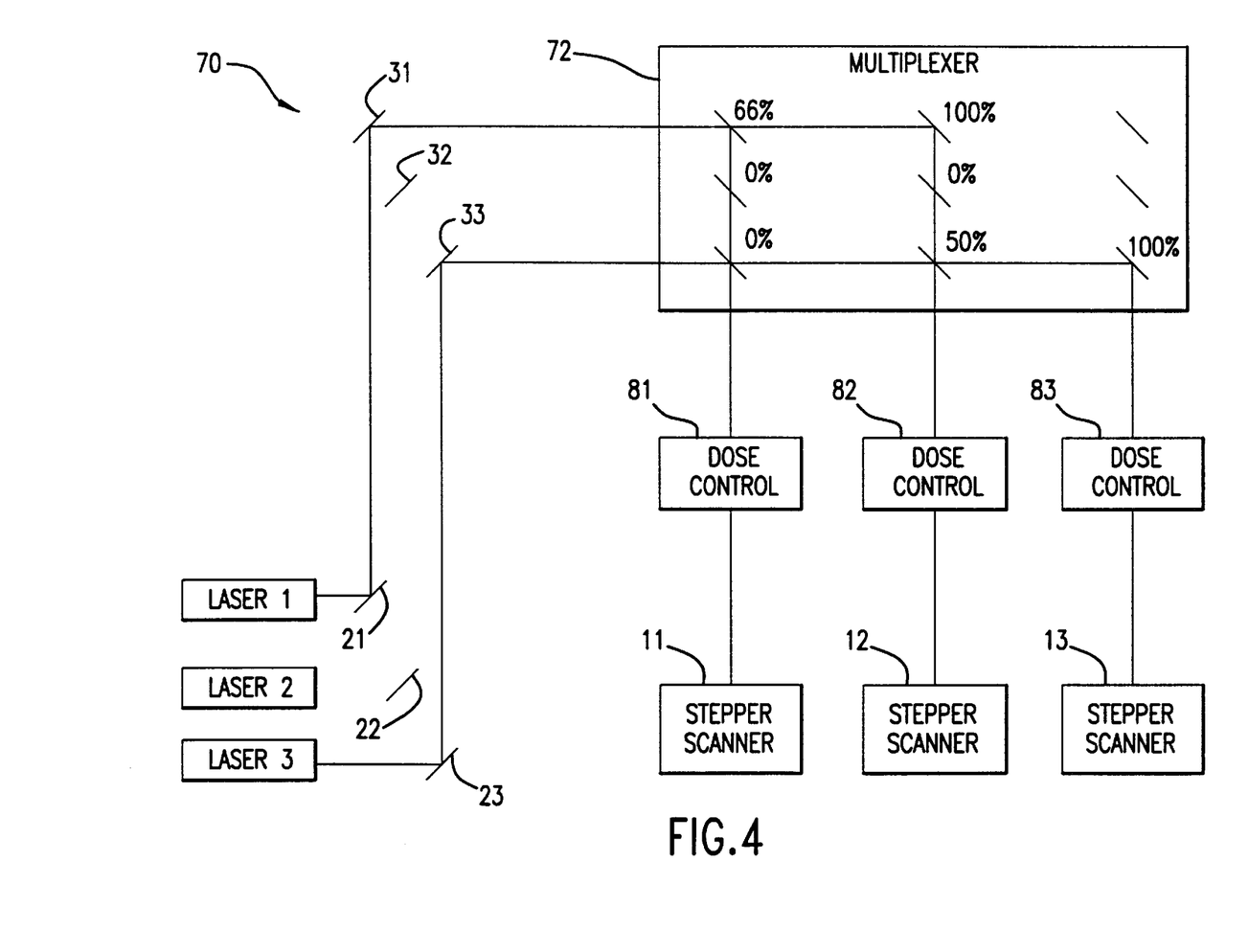

3. Laser 2 is down, lasers 1 and 3 working and all three stepper/scanners are working. This situation is shown in FIG. 4. In this case, mirrors 42 and 63 are 100%, mirror 41 is 66%, mirrors 62 are 50%, the rest of the mirrors absent or have substantially zero reflectance. Again, each exposure system 11–13 receives about ⅔ of the total laser energy from a single laser.

Figure 5:
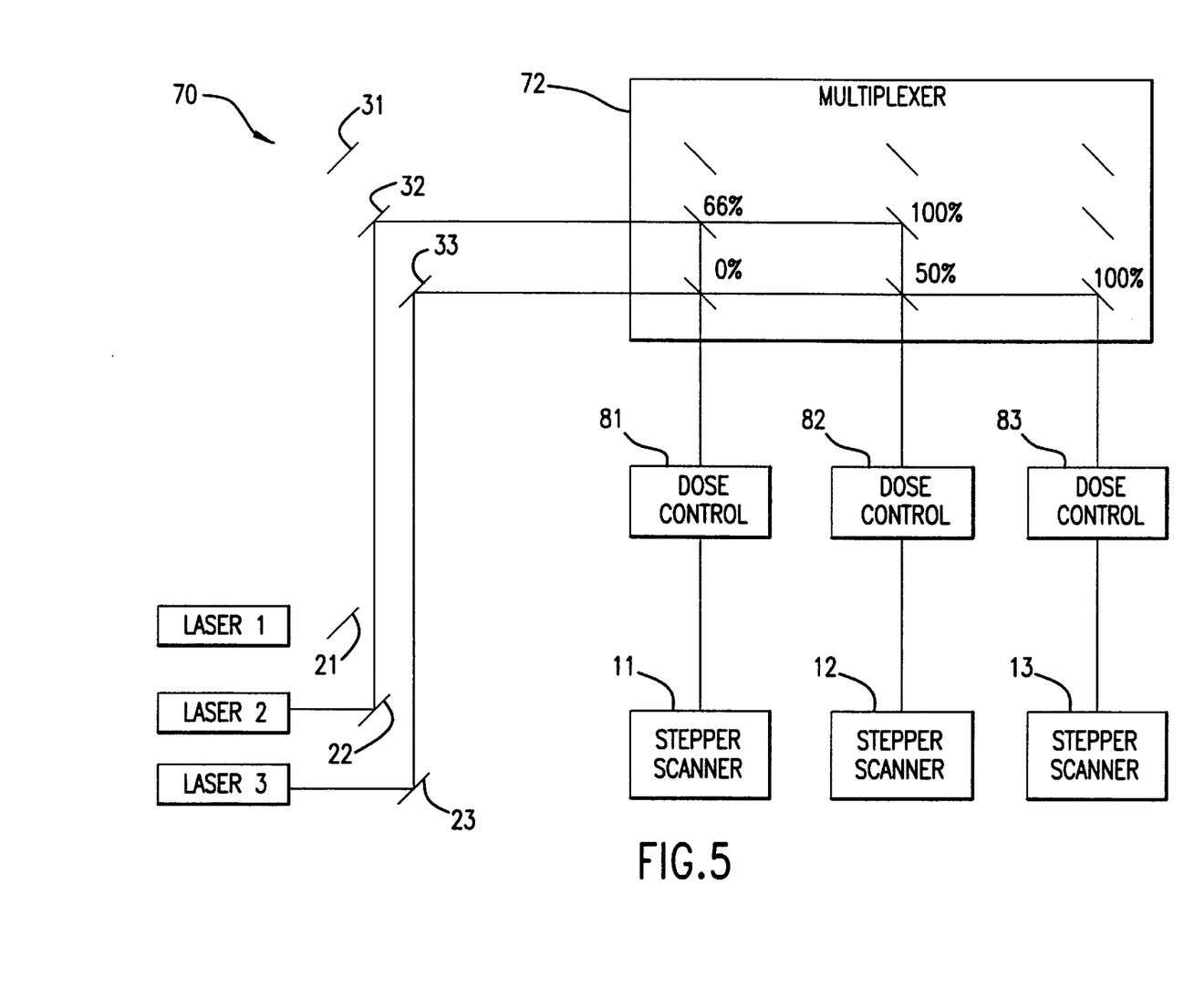

4. Laser 1 is down, lasers 2 and 3 are working and all three stepper/scanners are working. This situation is shown in FIG. 5. In this case, mirrors 52 and 63 are 100% mirror 51 is 66%, mirror 62 is 50%, the rest of mirrors absent or have substantially zero reflectance. Each exposure system 11–13 receives about ⅔ of the total laser energy from a single laser.

Figure 6:
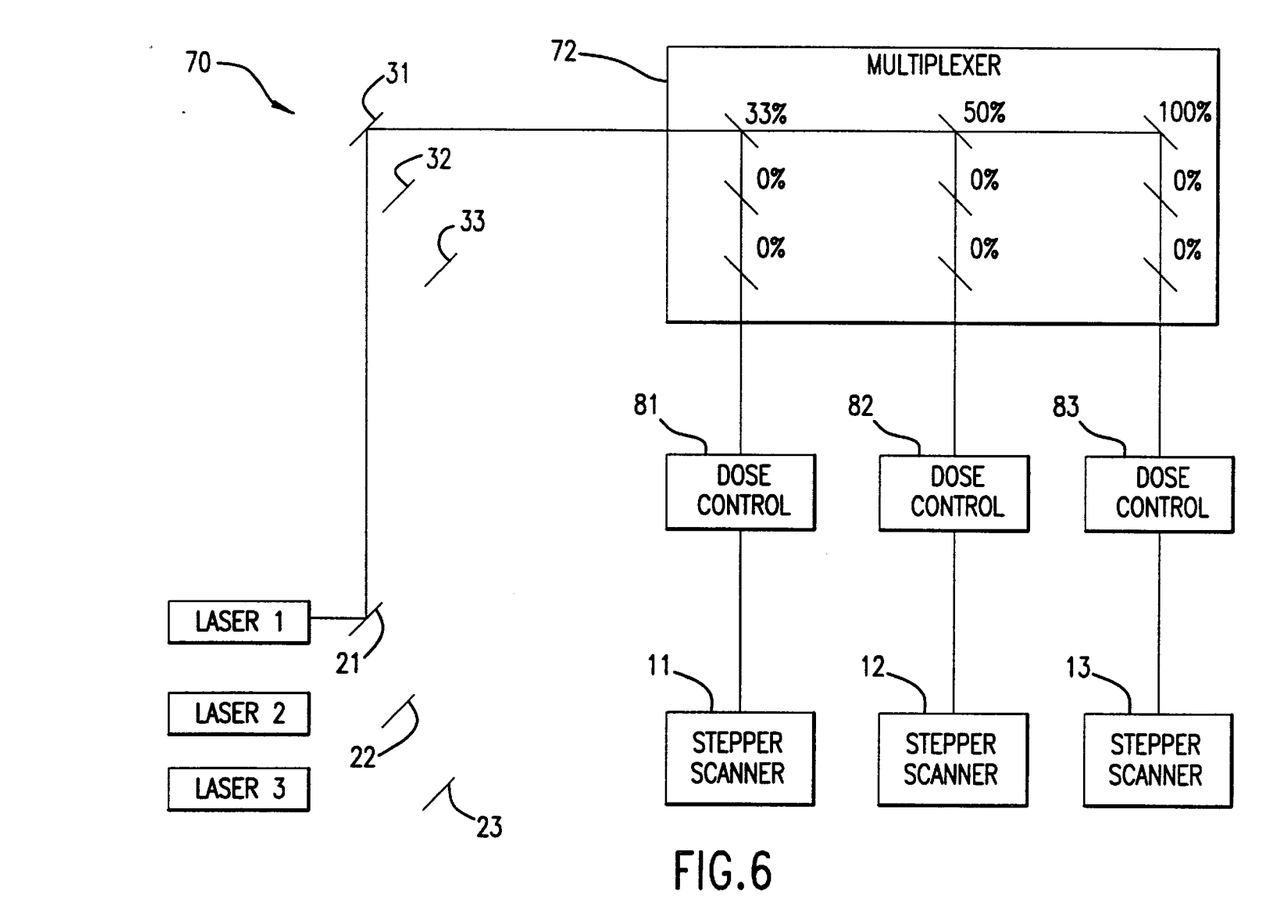

5. Lasers 2 and 3 are down, laser 1 is working and all three stepper/scanners are working. This situation is shown in FIG. 6. In this case, mirror 41 is 33%, mirror 42 is 50%, mirror 43 is 100%, other mirrors are absent or have substantially zero reflectance. Each exposure system 11–13 receives about ⅓ of the total laser energy from a single laser. With essentially the same arrangement all stepper/scanners could be illuminated with either laser 2 or 3.

Figure 7:
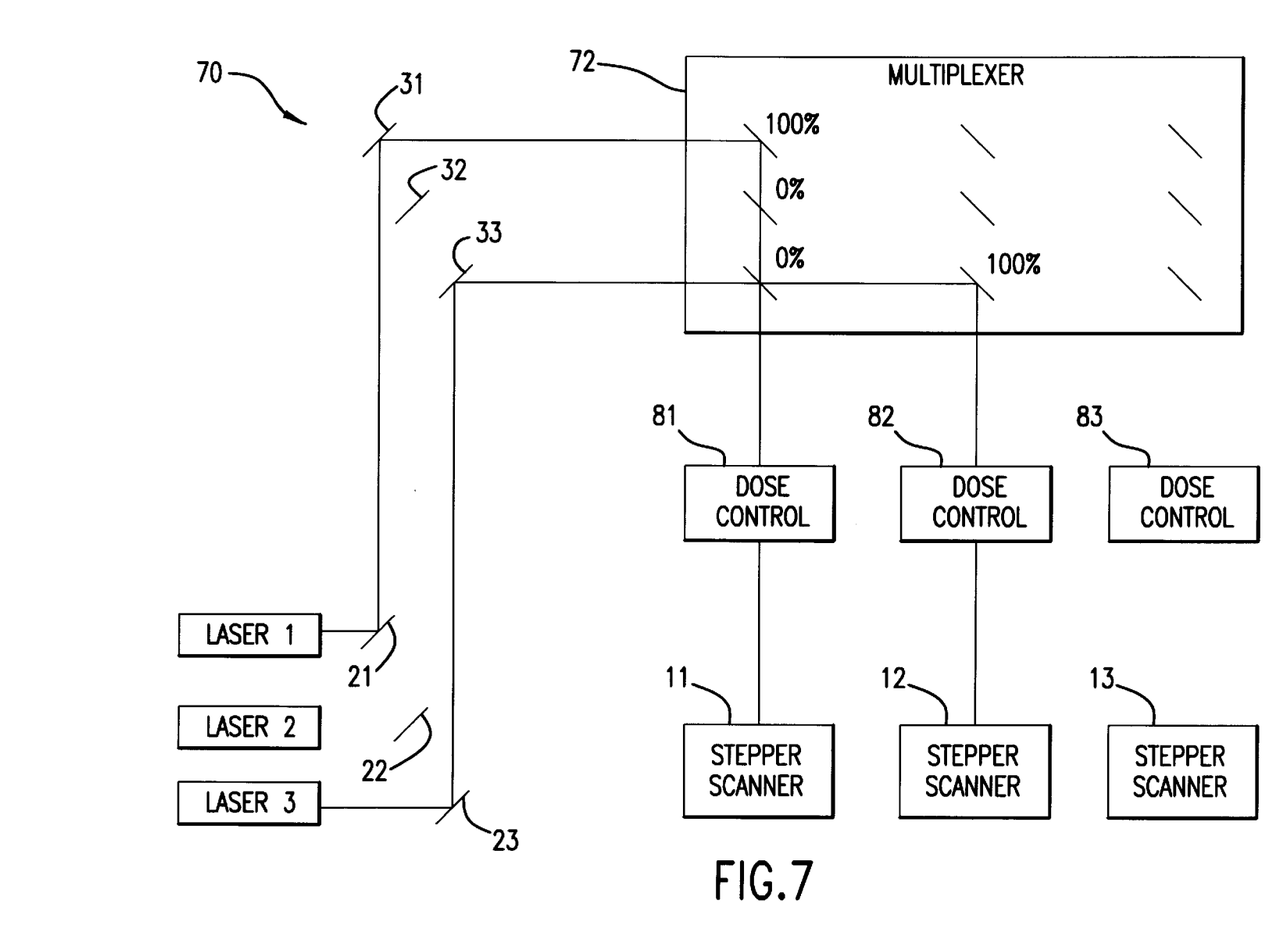

6. Lasers 1 and 3 are working and stepper/scanners 11 and 12 are working as shown in FIG. 7. In this case, mirror 41 is 100% and mirror 62 is 100% and all other mirrors are 0%.

In the preferred embodiments shown a dose control device 81, 82 and 83 is provided for fine tuning the dose at each stepper scanner. These devices could be any of several devices commercially available for controlling dose. For example, they could be mechanically rotated polarizer plates or absorbing plates with a gradient of absorption.

Figure 10:
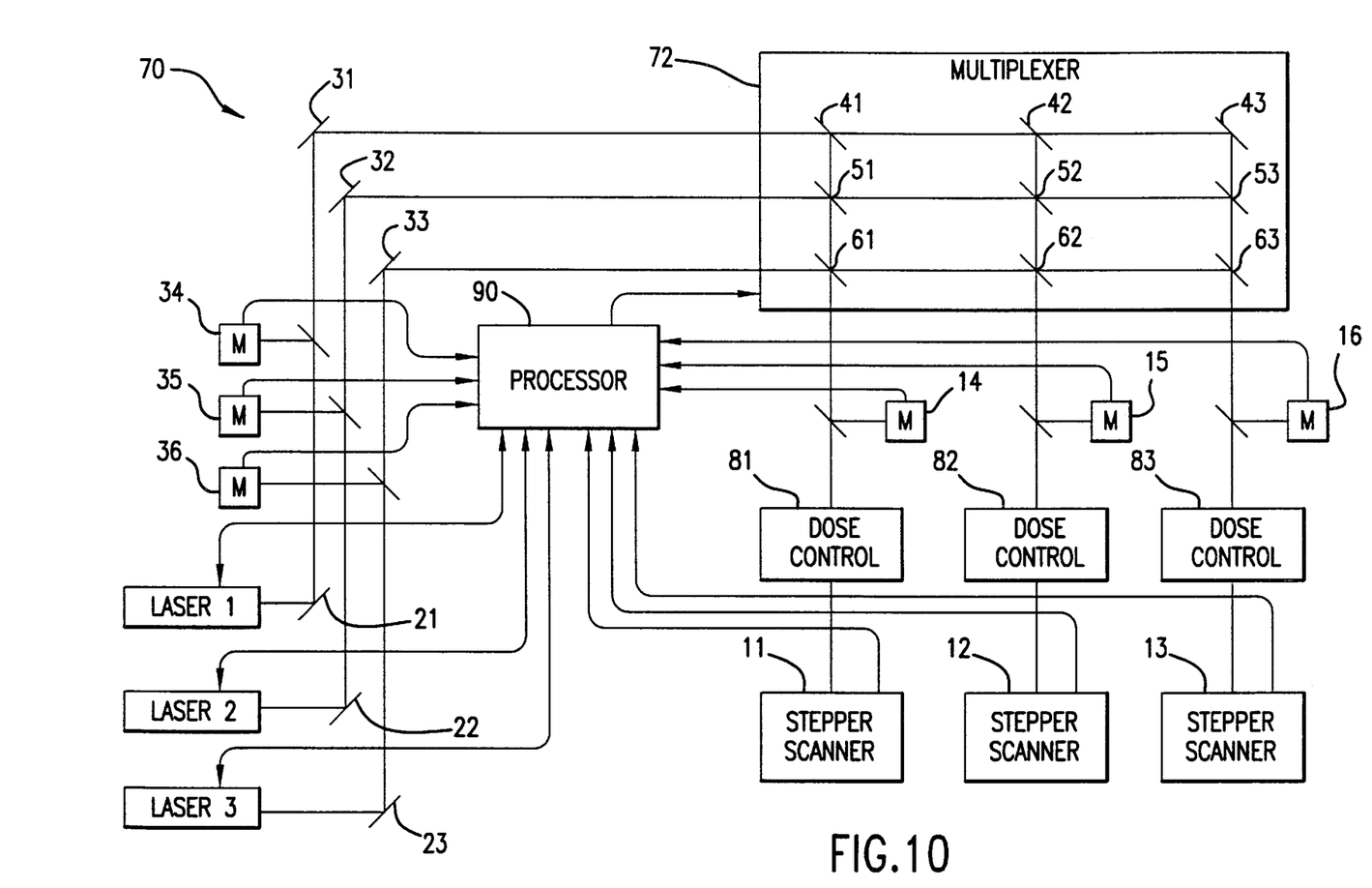
FIG. 10 shows a modification of the FIG. 1 embodiment with a processor to provide automatic control of the described equipment.

This system preferably should be equipped with a computer processor 90 as shown in FIG. 10 which controls the multiplexer mirror positions based on input requests from each of the stepper/scanners. In a preferred embodiment, this processor also receives input from laser pulse energy monitors 34, 35 and 36 and stepper scanner pulse energy monitors 14, 15, and 16 and the processor provides control of lasers 1, 2 and 3 so as to specify pulse timing repetition rate and pulse energy.

Persons skilled in the art will recognize that many other embodiments of the present invention are possible based on the teachings expressed in the above disclosure. For example, many other combinations of lasers and exposure tools are possible. The number of lasers does not need to equal the number of scanners. The number of lasers could be increased to any desired number such as 10 to 15 and the number of exposure tools could similarly be increased.

Therefore, the reader should determine the scope of the present invention by the appended claims and their legal equivalents.

We claim:

1. A laser lithography system comprising:
   A) a plurality of lasers;
   B) a plurality of exposure systems;
   C) a laser beam multiplexer comprising a plurality of mirror devices each mirror device comprising;
      1) a multi-reflectance mirror comprising a plurality of reflecting surfaces, each surface having a different reflectance;
      2) an adjusting mechanism for positioning one of said reflecting surfaces to intersect a laser beam from at least one of said plurality of lasers and reflecting at least a portion of said beam toward at least one of said plurality of exposure systems;

wherein laser light produced by each of said plurality of lasers is directed to said laser beam multiplexer where portions of the laser light within each beam is reflected or transmitted by one or more of said plurality of reflecting surfaces, the reflecting surfaces being positioned by said adjusting mechanism so that each of said plurality of exposure systems receives laser pulses produced by one or more of said plurality of lasers.

2. A system as in claim 1 wherein said plurality of lasers are a plurality of excimer lasers.

3. A system as in claim 1 wherein said plurality of exposure systems are a plurality of stepper machines.

4. A system as in claim 1 wherein said plurality of exposure systems are a plurality of scanner machines.

5. A system as in claim 1 wherein said plurality of exposure systems are a combination of one or more stepper machines and one or more scanner machines.

6. A system as in claim 1 wherein said plurality of surfaces define a plurality of reflectances.

7. A system as in claim 1 and further comprising a processor for controlling said adjusting mechanism based on inputs from said exposure systems.

8. A system as in claim 1 and further comprising laser pulse energy monitors for monitoring pulse energy from each of said plurality of lasers and stepper/scanner pulse energy monitors for monitoring pulse energy of laser beams directed toward each of said plurality of lithography exposure systems wherein signals from said energy monitor are utilized by said processor to control said plurality of lasers to specify pulse timing, repetition rate and pulse energy.

9. A system as in claim 8 wherein said processor receives input signals from said laser pulse energy monitors, said stepper/scanner pulse energy monitors and said lithography exposure systems and is programmed to control pulse energy production of each of said plurality of lasers based on said input.

* * * * *